(12) United States Patent
Nakazato et al.

(10) Patent No.: US 9,035,473 B2
(45) Date of Patent: May 19, 2015

(54) CIRCUIT DEVICE AND METHOD OF MANUFACTURING THE SAME

(75) Inventors: Isao Nakazato, Kumagaya (JP); Shigeharu Yoshiba, Gunma (JP); Takashi Sekibata, Gunma (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 273 days.

(21) Appl. No.: 12/568,487

(22) Filed: Sep. 28, 2009

(65) Prior Publication Data

US 2010/0078833 A1    Apr. 1, 2010

(30) Foreign Application Priority Data

Sep. 30, 2008   (JP) ................................. 2008-252997

(51) Int. Cl.
*H01L 23/29*   (2006.01)
*H01L 21/56*   (2006.01)
(Continued)

(52) U.S. Cl.
CPC ............ *H01L 23/295* (2013.01); *H01L 21/561* (2013.01); *H01L 21/565* (2013.01); *H01L 23/3121* (2013.01); *H01L 24/48* (2013.01); *H01L 24/97* (2013.01); *H01L 2224/32225* (2013.01); *H01L 2224/45124* (2013.01); *H01L 2224/45144* (2013.01); *H01L 2224/4809* (2013.01); *H01L 2224/48227* (2013.01); *H01L 2224/48465* (2013.01); *H01L 2224/48599* (2013.01); *H01L 2224/48699* (2013.01); *H01L 2224/73265* (2013.01); *H01L 2224/97* (2013.01); *H01L 2924/01013* (2013.01); *H01L 2924/01029* (2013.01); *H01L 2924/01033* (2013.01);

(Continued)

(58) Field of Classification Search
CPC ............... H01L 2924/181; H01L 2224/80904; H01L 2224/83904; H01L 21/67126; H01L 23/02; H01L 2224/48465; H01L 2224/45124; H01L 2224/45144; H01L 2224/73265; H01L 2224/4809; H01L 2224/48227; H01L 2224/48699
USPC .................. 257/777, 787, 788, 790, E23.123, 257/E23.092, E23.116, E23.119, E23.121, 257/795, 794, 789, 784, 678, 687, 734; 438/598, 599, 106, 125, 136, 127
See application file for complete search history.

(56) References Cited

U.S. PATENT DOCUMENTS 3,679,465 A * 7/1972 Flynn ............................ 427/386
4,767,433 A * 8/1988 Iura et al. ........................ 65/21.1
(Continued)

FOREIGN PATENT DOCUMENTS

CN   101173159    5/2008
EP   0962315  *  3/1999  .............. B32B 27/32
(Continued)

*Primary Examiner* — Galina Yushina

(57) ABSTRACT

Provided are a thin circuit device with show-through of thin metal wires prevented and a method of manufacturing the circuit device. A circuit device mainly includes: a substrate including a first substrate and second substrates; pads formed respectively on upper surfaces of the second substrates; a semiconductor element fixed on an upper surface of the first substrate; thin metal wires each connecting the semiconductor elements and a corresponding one of the pads; and a sealing resin with which the semiconductor element and the thin metal wires are covered, and which thereby seals the circuit device with the semiconductor element and the thin metal wires disposed therein. Furthermore, filler particles located in the uppermost portion of the sealing resin are covered with a resin material constituting the sealing resin.

20 Claims, 9 Drawing Sheets

(51) Int. Cl.
  *H01L 23/00* (2006.01)
  *H01L 23/31* (2006.01)

(52) U.S. Cl.
  CPC ............... *H01L2924/01079* (2013.01); *H01L 2924/01082* (2013.01); *H01L 2924/014* (2013.01); *H01L 2924/13091* (2013.01); *H01L 2924/01005* (2013.01); *H01L 2924/01006* (2013.01); *H01L 2924/01074* (2013.01); *H01L 2924/01075* (2013.01); *H01L 2924/1815* (2013.01); *H01L 2924/01014* (2013.01); *H01L 2924/3025* (2013.01); *H01L 24/45* (2013.01); *H01L 2224/45015* (2013.01); *H01L 2924/07802* (2013.01)

(56) References Cited

U.S. PATENT DOCUMENTS

| | | | | |
|---|---|---|---|---|
| 5,430,330 | A * | 7/1995 | Takahama et al. | 257/788 |
| 5,439,622 | A * | 8/1995 | Pennisi et al. | 264/401 |
| 5,656,098 | A * | 8/1997 | Ishikawa et al. | 136/256 |
| 6,169,136 | B1 * | 1/2001 | Iriguchi et al. | 524/492 |
| 6,261,501 | B1 * | 7/2001 | Miyagawa et al. | 264/272.15 |
| 6,544,816 | B1 * | 4/2003 | Lim et al. | 438/112 |
| 6,828,170 | B2 * | 12/2004 | Roberts et al. | 438/27 |
| 7,262,514 | B2 * | 8/2007 | Yoshikawa et al. | 257/793 |
| 7,517,480 | B2 * | 4/2009 | Sabin et al. | 264/40.1 |
| 7,566,978 | B2 * | 7/2009 | Taya et al. | 257/790 |
| 2005/0017339 | A1 * | 1/2005 | Yoshiba et al. | 257/686 |
| 2005/0048296 | A1 * | 3/2005 | Meguriya et al. | 428/447 |
| 2006/0017148 | A1 * | 1/2006 | Lee | 257/686 |
| 2006/0191708 | A1 * | 8/2006 | Kawasaki et al. | 174/255 |
| 2007/0009223 | A1 * | 1/2007 | Rudmann et al. | 385/147 |
| 2009/0075199 | A1 * | 3/2009 | Lungu | 430/281.1 |
| 2009/0152573 | A1 * | 6/2009 | Loh et al. | 257/89 |

FOREIGN PATENT DOCUMENTS

| | | |
|---|---|---|
| JP | 2000-156434 | 6/2000 |
| JP | 2000-164609 | 6/2000 |
| JP | 2004-356382 | 12/2004 |

\* cited by examiner

CIRCUIT DEVICE AND METHOD OF MANUFACTURING THE SAME

This application claims priority from Japanese Patent Application Number JP 2008-252997 filed on Sep. 30, 2008, the content of which is incorporated herein by reference in its entirety.

BACKGROUND OF THE INVENTION

1. Field of the Invention

The present invention relates to a circuit device in which a semiconductor element is thinly covered with a sealing resin mixed with filler particles and to a method of manufacturing the circuit device.

2. Description of the Related Art

A manufacturing process of a circuit device mainly includes: a front-end process in which desired elements are incorporated into a surface of a single semiconductor wafer; and a back-end process in which packaging is performed on the semiconductor elements obtained by dividing the semiconductor wafer into pieces.

In recent years, there has been developed a manufacturing method in which multiple circuit devices are sealed by a resin in a single sealing step, the resultant resin-sealed body is divided by dicing to obtain separate circuit devices. This technology is described for instance in Japanese Patent Application Publication No. 2000-164609.

With reference to FIGS. 8A to 8D, the above-mentioned method of manufacturing a circuit device will be described. FIGS. 8A to 8D are cross sectional views each showing a manufacturing step.

Referring to FIG. 8A, firstly, conductive patterns 102 and semiconductor elements 106, which constitute a large number of circuit devices, are arranged on an upper surface of a substrate 100. The substrate 100 is made of ceramic or a resin material and the multiple conductive patterns 102 are formed on the upper surface of the substrate 100. Here, a unit 108 to serve as one circuit device is constituted of multiple conductive patterns 102. Each of the semiconductor elements 106 is fixed on a corresponding one of the conductive patterns 102 of the unit 108, and an electrode of the semiconductor element 106 is connected to a different one of the conductive patterns 102 via a thin metal wire 104.

Referring to FIG. 8B, a sealing resin 110 is applied to the upper surface of the substrate 100 so as to cover the multiple units 108. The sealing resin 110 is made of a resin mixed with granular filler particles of silica ($SiO_2$) or the like. The sealing resin 110 in a liquid or semisolid state is provided on the upper surface of the substrate 100 and then hardened.

Referring to FIG. 8C, grinding is then performed on the top surface of the sealing resin 110, so that the sealing resin 110 is made thinner and the top surface of the sealing resin 110 is planarized.

Referring to FIG. 8D, subsequently, the sealing resin 110 and the substrate 100 are divided by dicing at boundaries of the units 108 to obtain separate circuit devices.

With the above manufacturing steps, a large number of circuit devices are collectively manufactured. This leads to an advantage that productivity of the circuit devices is improved.

However, when the sealing resin 110 shown in FIG. 8C is made thin so that the circuit devices to be manufactured can be thin, the aforementioned manufacturing method poses a problem that the thin metal wires 104 show through the covering sealing resin 110.

Specifically, the sealing resin 110 used for resin sealing is made of a resin material containing filler particles of silica or the like. Silica is a transparent material which transmits light easily. This means that, when the top surface of the sealing resin 110 is ground so that the sealing resin 110 covering the thin metal wires 104 would be thinner, i.e., approximately 50 μm thin, light from the outside easily reaches the thin metal wires 104 through the filler particles.

FIG. 9 is an image obtained by shooting a cross section of a conventional circuit device, showing a taken image of the thin metal wire 104 and the sealing resin 110 covering the thin metal wire 104. In this image, the top surface of the sealing resin 110 is shown by a dotted line and a filler particle partially exposed to the outside from the top surface of the sealing resin 110 is encircled by a white oval.

Referring to this image, the thickness of a portion, covering the thin metal wire 104, of the sealing resin 110 is approximately 50 μm, for example, and might be smaller than the diameter of the filler particle. This produces a portion in which the thin metal wire 104 is covered with the filler particle only, not with the resin material. Since the filler particle is more transparent than the resin material, light from the outside easily reaches the thin metal wire 104 through the filler particle. Consequently, the thin metal wire 104 shows through the filler particle. This show-through of the thin metal wire 104 detracts from the external appearance of the circuit device.

SUMMARY OF THE INVENTION

The present invention has been made in consideration of the problem mentioned above. An object of the present invention is to provide a circuit device made thin with show-through of thin metal wires prevented and to provide a method of manufacturing the circuit device.

A circuit device of the present invention includes: a semiconductor element; a conductive member connected to the semiconductor element via a thin metal wire; and a sealing resin which is made of a resin material mixed with filler particles and which covers the semiconductor element and the thin metal wire. The thickness, of the sealing resin, for covering a top portion of the thin metal wire is made smaller than a maximum diameter of the filler particles and the filler particles located in an uppermost portion of the sealing resin are covered with the sealing resin.

A method of manufacturing a circuit device includes the steps of: connecting an electrode formed on an upper surface of a semiconductor element to a conductive member via a thin metal wire; and covering the semiconductor element and the thin metal wire with a sealing resin by injection molding using a mold, the sealing resin being made of a resin material mixed with filler particles. In the covering step, a thickness, of the sealing resin, for covering a top portion of the thin metal wire is made smaller than a maximum diameter of the filler particles, and the filler particles located in an uppermost portion of the sealing resin are covered with the resin material.

According to an aspect of the present invention, the thickness of a part, covering the top portion of the thin metal wire, of the sealing resin is made smaller than the maximum diameter of the filler particles contained in the sealing resin, and furthermore the filler particles located in the uppermost portion are covered with the resin material. Accordingly, the transparent filler particles are not exposed to the outside, and thus the problem of the show-through of the thin metal wire is improved.

BRIEF DESCRIPTION OF THE DRAWINGS

FIG. 1A is a cross-sectional view, FIG. 1B is an enlarged cross-sectional view, and FIG. 1C is an image obtained by shooting a cross section of the circuit device.

FIG. 2A is a perspective view, and FIGS. 2B and 2C are enlarged cross-sectional views.

FIG. 3A is a plan view, and FIGS. 3B and 3C are cross-sectional views.

FIG. 5A is a cross-sectional view, FIG. 5B is a plan view, and FIG. 5C is an enlarged cross-sectional view.

FIG. 6A is a plan view and FIG. 6B is an enlarged cross-sectional view.

DESCRIPTION OF THE INVENTION

Figure 1A:
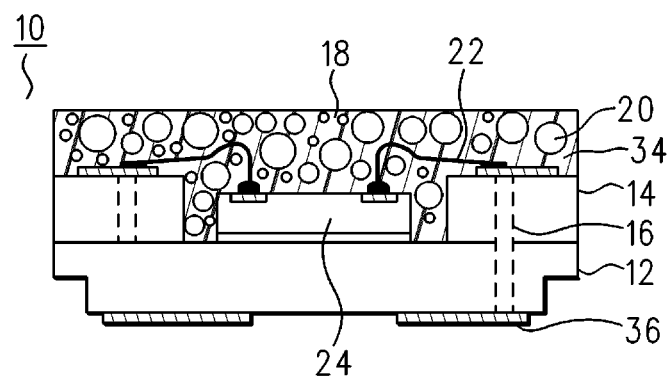
FIGS. 1A to 1C each show a circuit device of a preferred embodiment.
Figure 1B:
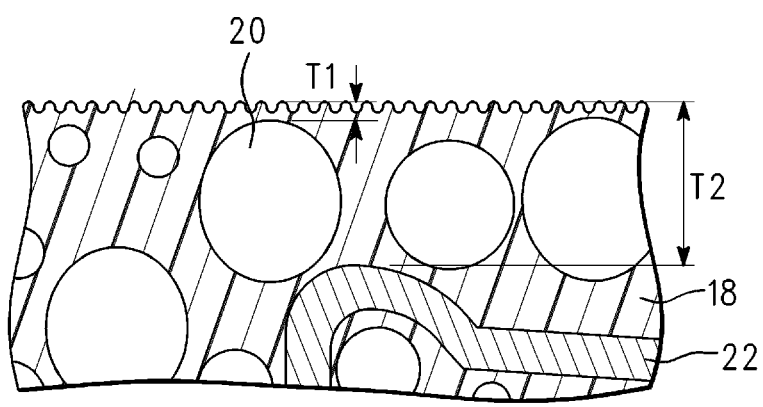
Figure 1C:
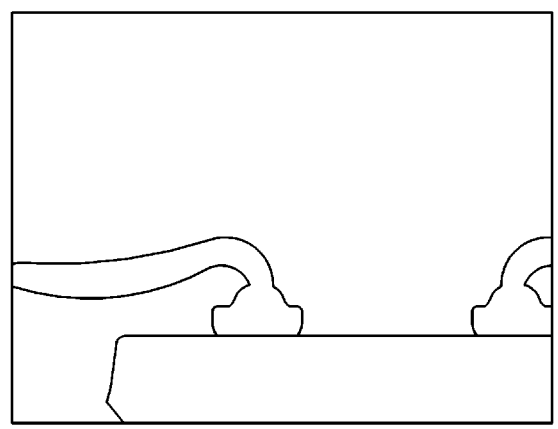

With reference to FIGS. 1A to 1C, a description is given of a structure of a circuit device 10 according to an embodiment. FIG. 1A is a cross-sectional view of the circuit device 10, FIG. 1B is an enlarged cross-sectional view of a part of the circuit device 10, and FIG. 1C is an image obtained by shooting a cross section of the circuit device 10 actually manufactured.

Referring to FIG. 1A, the circuit device 10 mainly includes a substrate including a first substrate 12 and second substrates 14; pads 34 formed respectively on upper surfaces of the second substrates 14; semiconductor element 24 fixed to an upper surface of the first substrate 12; thin metal wires 22 each connecting the semiconductor element 24 and a corresponding one of the pads 34; and a sealing resin 18 covering and sealing the semiconductor element 24 and the thin metal wires 22.

The first substrate 12 is made of an insulating material such as ceramic or a resin material. The planar size of the first substrate 12 is slightly larger than the semiconductor element 24, and the thickness thereof is approximately 100 μm, for example.

The circuit device 10 has lower left and right portions rectangularly removed by dicing. On a lower surface of the first substrate 12, formed are external electrodes 36 made of a copper foil or the like. In the mounting of the circuit device 10, surface mounting is performed by welding a conductive adhesive such as solder to the external electrodes 36.

Each of the second substrates 14 is deposited on the upper surface of the first substrate 12 at both sides of the semiconductor element 24, and has the pad 34 formed thereon. The same material and thickness as the first substrate 12 may be employed for the second substrates 14. Each of the thin metal wires 22 made of gold or aluminum is connected to the corresponding pad 34 formed on the second substrate 14.

Additionally, the pad 34 formed on the second substrate 14 is connected to a corresponding one of the external electrodes 36 formed on the lower surface of the first substrate 12 via a through hole 16 provided in such a manner as to continuously penetrate the first substrate 12 and the second substrate 14. The through hole 16 is filled with a conductive material such as gold or copper. The pad 34 provided on the second substrate 14 and the external electrode 36 provided on the first substrate 12 are formed in the following manner. Conductive pastes containing tungsten or the like are formed into predetermined shapes, respectively, on the first substrate 12 and the second substrates 14, and then are covered with gold plating films.

The semiconductor element 24 is a discrete transistor such as a MOSFET or a bipolar transistor, or an IC. A lower surface of the semiconductor element 24 is fixed to the upper surface of the first substrate 12 with a conductive adhesive such as solder or an insulating adhesive. Here, although one semiconductor element 24 is mounted on the first substrate 12, multiple elements may be fixed on the upper surface of the first substrate 12. Furthermore, an island may be provided on the first substrate 12, so that the semiconductor element 24 is mounted on an upper surface of the island.

The thin metal wire 22 is a thin wire made of gold or aluminum and having a diameter of approximately 10 μm. The thin metal wire 22 electrically connects one of electrodes provided on the upper surface of the semiconductor element 24 and the corresponding pad 34 provided on the upper surface of the second substrate 14. In this embodiment, a portion of the thin metal wire 22 has a curve shape and the other portion thereof has a straight line shape. Specifically, a portion, around an end portion connected to the electrode, of the thin metal wire 22 is shaped like part of a circle or an oval and this portion includes a top portion of the thin metal wire 22. The curved portion of the thin metal wire 22 is recrystallized by heating in a wire bonding step, and thus has high hardness, while the straight portion thereof has relatively low hardness. As compared to a case where the thin metal wire 22 is formed to be curved uniformly, forming the thin metal wire 22 in this manner makes it possible to locate the top portion of the thin metal wire 22 at a relatively low position, thereby making the entire device thinner as a result.

The sealing resin 18 is made of a resin material mixed with a filler. Spherical silica, for example, is employed as a filler, and the maximum particle size of the filler particles is approximately 55 μm, for example. The volume percent of the filler mixed in the sealing resin 18 is approximately 70 volume percent, for example. The resin material contained in the sealing resin 18 may be a thermosetting resin such as an epoxy resin, or may be a thermoplastic resin. In this embodiment, filler particles 20 are not basically exposed from an upper surface of the circuit device 10, and the upper surface of the circuit device 10 is formed of the resin material contained in the sealing resin 18.

Referring to FIG. 1B, the thickness of a part, covering the top portion of the thin metal wire 22, of the sealing resin 18 is designed to be smaller than the maximum particle size of the filler particles 20 contained in the sealing resin 18. Specifically, when the maximum particle size of the spherical filler particles 20 is 55 μm, for example, as described above, a thickness T2 of the part, covering the top portion of the thin metal wire 22, of the sealing resin 18 is approximately 40 μm. Filler particles 20 located in the uppermost portion of the sealing resin 18 are covered with the resin material, and a covering thickness T1 is approximately 8 μm, for example. In other words, in this embodiment, the filler particles 20 located near the top surface of the sealing resin 18 are covered with the resin material, and thus not exposed to the outside from the upper surface thereof.

In this embodiment, in order to make the circuit device 10 thinner, the sealing resin 18 covering the semiconductor element 24 is made as thin as possible. However, when the sealing resin 18 is made thin, the thin metal wires 22 and the pads 34 might show through the filler particles 20 because the filler particles 20 contained in the sealing resin 18 transmit light. In this embodiment, in order to prevent the show-through, the filler particles 20 in the uppermost portion of the sealing resin 18 are covered with a resin material having higher light shielding properties than at least the filler particles 20. Covering the filler particles 20 in this manner shields the light entering from the outside into the resin material covering the filler particles 20, thus reducing the amount of the light which enters the filler particles 20 from the outside. Consequently, this restrains the show-through of the thin metal wires 22 and pads 34. Furthermore, since the filler particles 20 are not exposed to the outside from the sealing resin 18, the interface between each of the filler particles 20 and the resin material is not exposed to the outside from the top surface of the sealing resin 18. This exerts an advantage that pressure resistance is also improved.

Moreover, in this embodiment, the top surface of the sealing resin 18 is a textured surface where fine concaves and convexes are formed. Accordingly, the textured surface causes the light from the outside to diffuse, thereby restraining the light entering the circuit device 10. This enhances an effect of restraining the show-through of the thin metal wires 22.

FIG. 1C is a cross-sectional view obtained by shooting the actually manufactured circuit device. As clear from FIG. 1C, a filler particle in the uppermost portion of the sealing resin 18 is covered with a resin material and is not exposed from the top surface of the sealing resin 18.

Figure 2A:
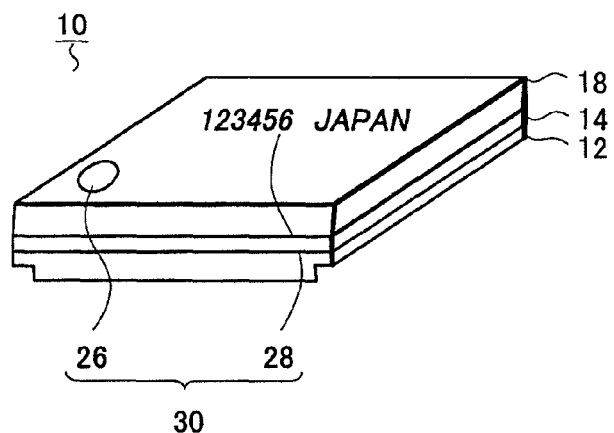
FIGS. 2A to 2C each show the circuit device of the preferred embodiment.
Figure 2B:
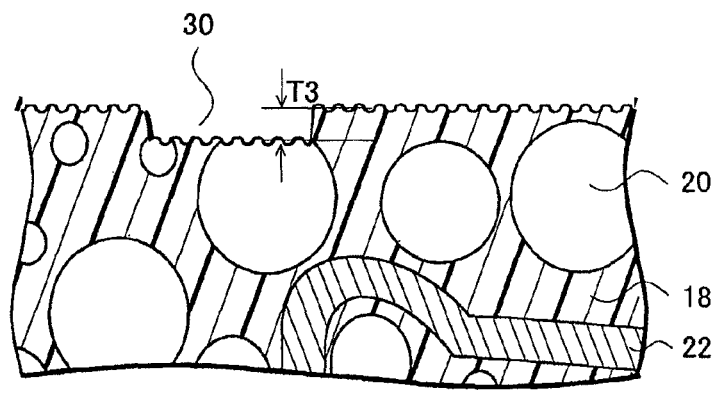
Figure 2C:
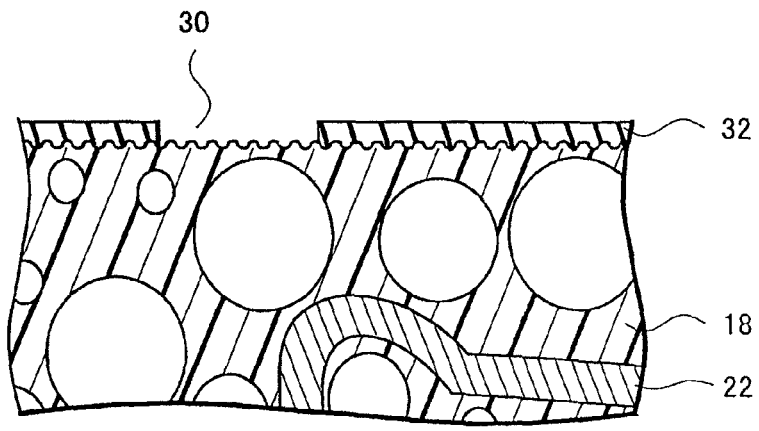

With reference to FIGS. 2A to 2C, the structure of the circuit device 10 will be described further. FIG. 2A is a perspective view showing the circuit device 10, and FIGS. 2B and 2C are cross-sectional views each enlargedly showing a portion in which an identification mark 30 is provided.

Referring to FIG. 2A, the identification mark 30 including a position mark 26 and a sign mark 28 is engraved in the top surface of the sealing resin 18. The position mark 26 is provided so as to detect a planar position (angle) of the circuit device 10. Here, the position mark 26 is provided in the lower left corner of the circuit device 10. Meanwhile, the sign mark 28 is formed of characters, numerals, and the like, representing the manufacturer name, the manufacturing time, the product name, the lot number, characteristics of the built-in element, and the like. The identification mark 30 is formed by irradiating the top surface of the sealing resin 18 with laser and thus by removing part of the sealing resin 18 from the top surface thereof.

As described above, the sealing resin 18 covering the semiconductor element 24 and the thin metal wires 22 is formed extremely thin so as to make the circuit device 10 thin. Accordingly, when the identification mark 30 is formed by using a large amount of laser output, heat due to the laser might adversely affect the semiconductor element 24. Here, in order to restrain the adverse effect, the amount of laser output is reduced as compared to a normal case.

Referring to FIG. 2B, the identification mark 30 is formed by irradiating the top surface of the sealing resin 18 with laser and thus by partially removing an upper portion of the sealing resin 18 so as to have a depth of approximately 10 μm (T3). Generally, an approximately 20 μm-deep portion of a resin material is removed in laser treatment for forming an identification mark. The depth T3 is very small for a depth for engraving. As described above, control of the amount of laser irradiation output can prevent the semiconductor element 24 from being destroyed due to laser irradiation, while ensuring a certain level of legibility of the identification mark 30.

FIG. 2C shows another structure of the identification mark 30. Here, the top surface of the sealing resin 18 is entirely covered with a covering layer 32, and the identification mark 30 is formed by partially removing the covering layer 32. The covering layer 32 is made of, for example, a white coating or the like whose color is different from that of the sealing resin 18. The identification mark 30 is formed by: entirely covering the top surface of the sealing resin 18 with the covering layer 32; and partially removing the covering layer 32 by laser irradiation to expose part of the sealing resin 18 to the outside. Forming the identification mark 30 in this manner causes the laser to remove almost no sealing resin 18, thus preventing the destruction of the semiconductor element 24 due to the laser irradiation.

With reference to FIGS. 3A to 7, a description is given below of a method of manufacturing a circuit device having the above structure.

Figure 3A:
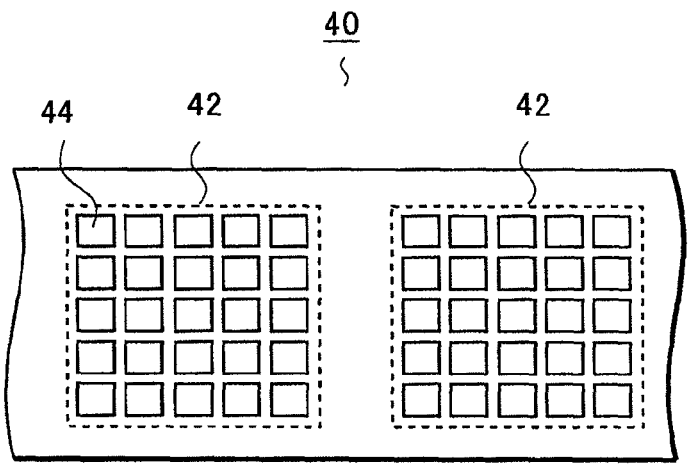
FIGS. 3A to 3C each show a method of manufacturing the circuit device of the preferred embodiment.
Figure 3B:
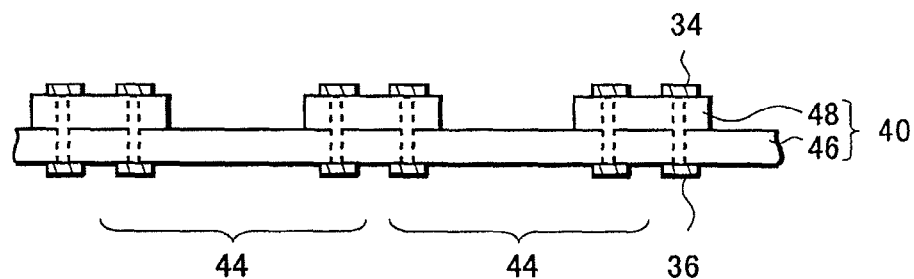
Figure 3C:
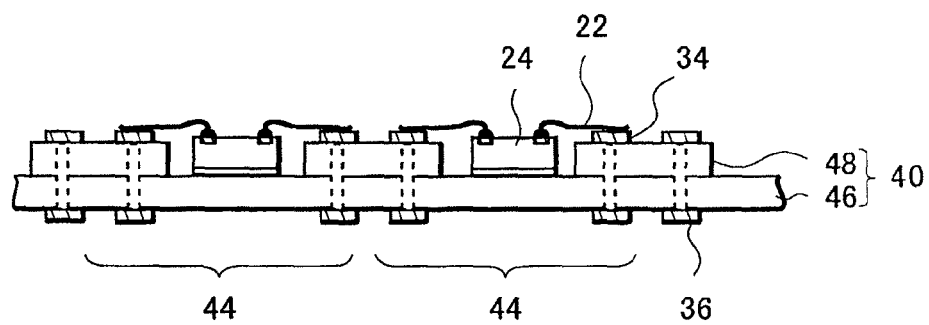

Referring to FIGS. 3A to 3C, firstly, a substrate is prepared and semiconductor elements are mounted thereon. FIG. 3A is a plan view of a substrate 40, FIG. 3B is a partial cross-sectional view of the substrate 40, and FIG. 3C is a cross-sectional view of the substrate 40 after connection of the semiconductor elements 24.

Referring to FIG. 3A, the substrate 40 made of an insulating material, for example, ceramic or the like has a rectangular shape, and multiple blocks 42 are arranged so as to be spaced from each other Here, although two blocks 42 are illustrated, additional multiple blocks 42 may be arranged on the substrate 40. One block 42 includes a large number of units 44 in a matrix form. In this embodiment, resin sealing by transfer molding is performed for each block 42.

Referring to FIG. 3B, the substrate 40 includes a first substrate 46 and second substrates 48 stacked in this order. The first substrate 46 is formed of a ceramic substrate or the like having a thickness of approximately 100 μm, and is provided with the external electrodes 36 on a lower surface of the first substrate 46. Moreover, each of the second substrates 48 is stacked on the first substrate 46 in a portion corresponding to a periphery of each unit 44, and the pads 34 are provided on the second substrate 48. Additionally, each of the pads 34 provided on the second substrate 48 is electrically connected to a corresponding one of the external electrodes 36 provided on the lower surface of the first substrate 46 via a through hole provided in such a manner as to penetrate the first substrate 46 and the second substrate 48.

Referring to FIG. 3C, the semiconductor elements 24 are then connected to the units 44 of the substrate 40. The lower surface of each of the semiconductor elements 24, which are discrete transistors, ICs, or the like, is fixed to the upper surface of the first substrate 46. Each of electrodes provided on the upper surface of the semiconductor element 24 are connected to the corresponding pad 34 via the thin metal wire 22. In this embodiment, as described above, the portion, around the end portion to be connected to the semiconductor element 24, of each of the thin metal wires 22 has the curve shape like part of a circle or an oval, while the other portion to be connected to the pad 34 has the straight line shape.

Figure 4A:
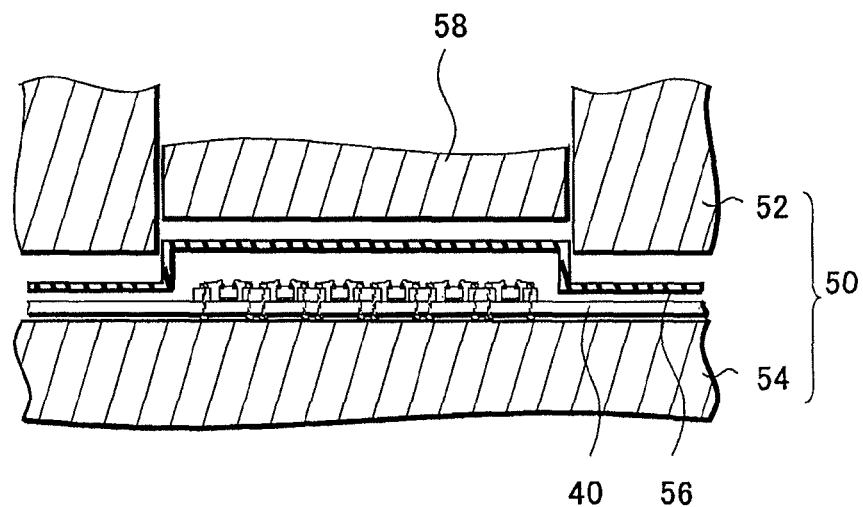
FIGS. 4A and B are cross-sectional views each showing the method of manufacturing the circuit device of the preferred embodiment.
Figure 4B:
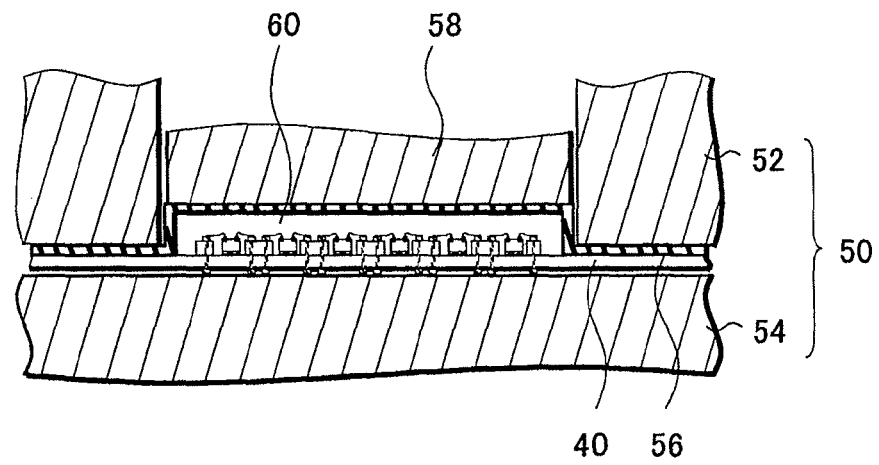

Referring to FIGS. 4A and 4B, the substrate 40 with the semiconductor elements 24 mounted thereon is then set in a mold 50. Referring to FIG. 4A, transfer molding using the mold 50 including an upper mold 52 and a lower mold 54 is performed in this step. Here, the upper mold 52 includes a movable part 58 which can be moved in a vertical direction. Raising the movable part 58 makes a sealing resin to be formed thicker, while lowering the movable part 58 makes the sealing resin to be formed thinner. In this embodiment, a release sheet 56 made of a resin is brought into close contact with an inner wall of the upper mold 52. This makes it easy to release the sealing resin from the mold 50 after a resin sealing step. Further, fine concaves and convexes are formed on a lower surface of the release sheet 56, thereby allowing the resultant sealing resin to have a textured surface with the fine concaves and convexes.

Referring to FIG. 4B, the upper mold 52 and the lower mold 54 having the above structure are brought into contact with each other, and thereby a cavity 60 is formed. Each of the blocks 42 shown in FIG. 3A is individually accommodated in the cavity 60.

Figure 5A:
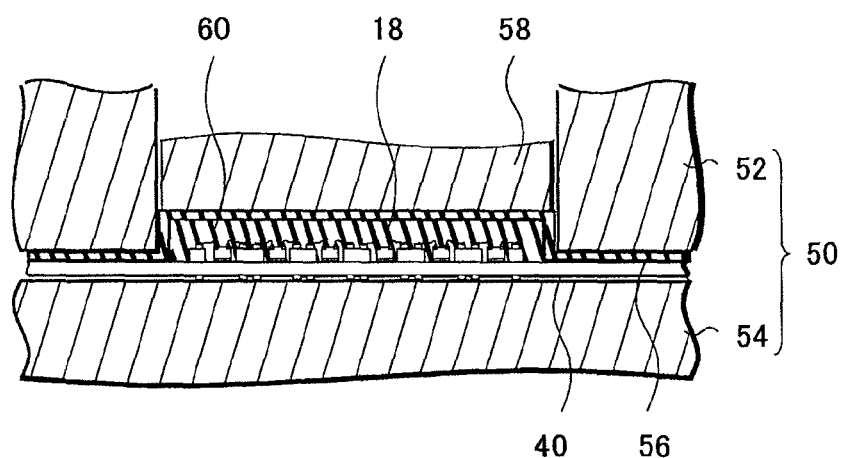
FIGS. 5A to 5C each show the method of manufacturing the circuit device of the preferred embodiment.
Figure 5B:
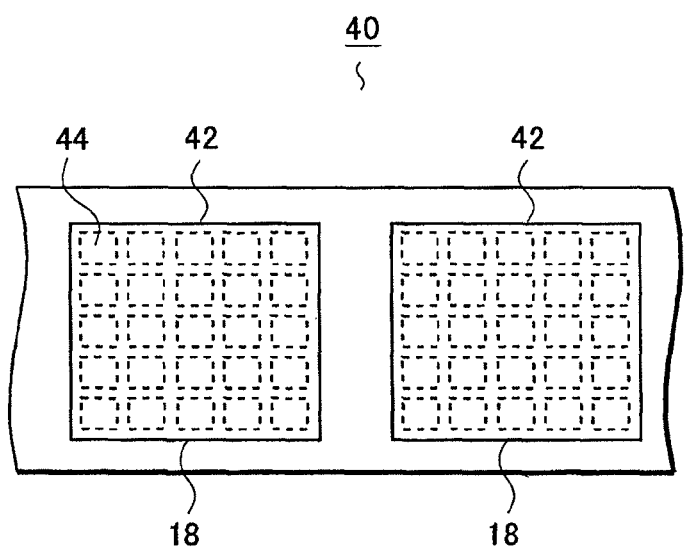
Figure 5C:
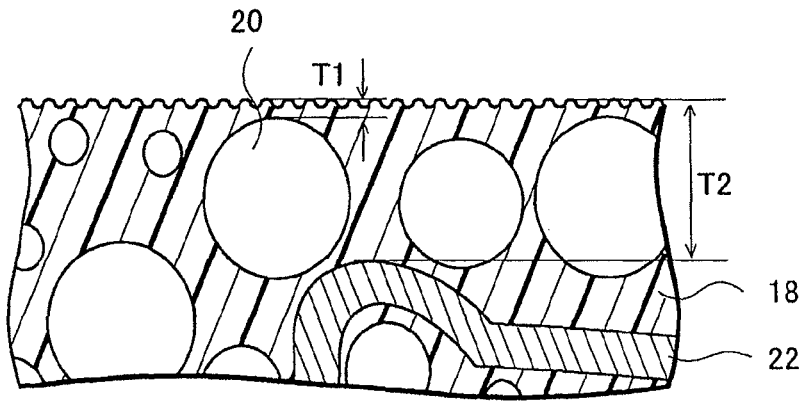

Referring to FIGS. 5A to 5C, the sealing resin 18 in a liquid or semisolid state is subsequently injected into the cavity 60. FIG. 5A is a cross-sectional view showing the resin sealing step, FIG. 5B is a plan view showing the substrate 40 after the resin sealing is completed, and FIG. 5C is a cross-sectional view enlargedly showing the sealing resin 18.

Referring to FIG. 5A, the sealing resin 18 is injected into the cavity 60 from an unillustrated gate to cover upper surfaces of the semiconductor elements 24, the thin metal wires 22 and the substrate 40 included in each block. After the injection of the sealing resin 18 is completed, heating for hardening the sealing resin 18 is performed, the upper mold 52 and the lower mold 54 are released, and then the substrate 40 with the sealing resin 18 formed thereon is released from the mold 50.

Referring to FIG. 5B, after the above resin sealing step is completed, the sealing resin 18 is formed to cover each block 42 of the substrate 40. Meanwhile, in order to prevent the resin chipped due to a dicing blade in a later dicing step from affecting the product, the sealing resin 18 is formed in a larger area than the block 42 where the units 44 are formed.

Referring to FIG. 5C, the sealing resin 18 is formed by injection molding using the mold 50 in the resin sealing step, and thus the filler particles 20 contained in the sealing resin 18 are covered with the resin material. The thickness T1 of the part, covering the filler particles 20 located in the uppermost portion of the sealing resin 18, of the resin material is not less than approximately 8 μm, for example. Moreover, the thickness T2, covering the top portion of the thin metal wire 22, of the sealing resin 18 is not more than approximately 40 μm, and is smaller than the maximum particle size (55 μm) of the filler particles 20 contained in the sealing resin 18.

As described above, the filler particles 20 located in the uppermost portion of the sealing resin 18 are covered with the resin material having light shielding properties, and thus light from the outside does not reach the transparent filler particles 20. This prevents the thin metal wires 22 and patterns from showing through the filler particles 20. Incidentally, the top surface of the sealing resin 18 is the textured surface corresponding to the concavo-convex shape of the lower surface of the release sheet 56.

Figure 6A:
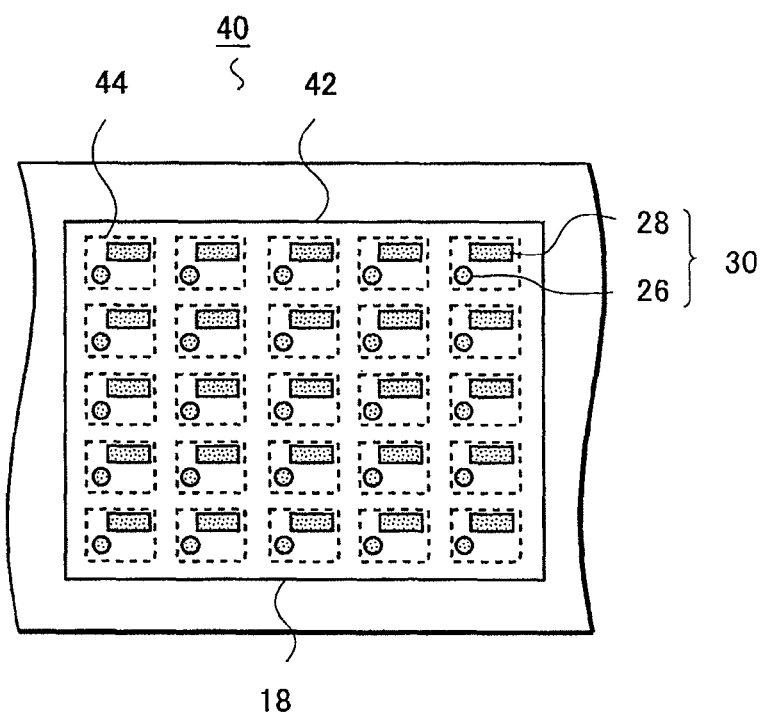
FIGS. 6A and 6B each show the method of manufacturing the circuit device of the preferred embodiment.
Figure 6B:
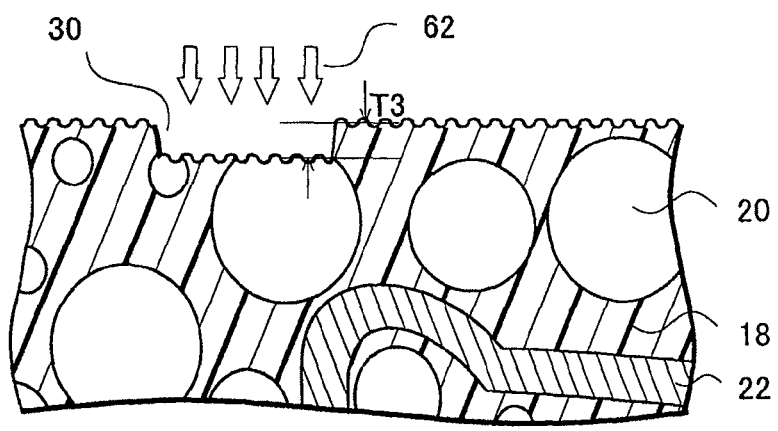

Referring to FIGS. 6A and 6B, identification marks 30 are then engraved in the top surface of the sealing resin 18. FIG. 6A is a plan view showing the engraving step and FIG. 6B is a cross-sectional view showing laser irradiation.

Referring to FIG. 6A, each identification mark 30 including the position mark 26 and the sign mark 28 is engraved by laser in surfaces of the units 44 included in the block 42.

Referring to FIG. 6B, the identification mark 30 having a groove shape is formed by irradiating the top surface of the sealing resin 18 with laser 62 from the above and thus by slightly removing the sealing resin 18 from the top surface thereof. In this embodiment, since the sealing resin 18 is formed extremely thin so as to achieve the thinning of a package, energy of the laser used for irradiating the sealing resin 18 is likely to affect the semiconductor elements 24 adversely. In order to prevent this adverse effect, the energy of the laser is controlled, and small energy of the laser thus controlled results in the identification mark 30 having a depth of not more than 10 μm.

Alternatively, the identification mark 30 may be formed by covering the top surface of the sealing resin 18 with the covering layer 32 as shown in FIG. 2C and thus by partially removing the covering layer 32 by the laser irradiation.

Figure 7:
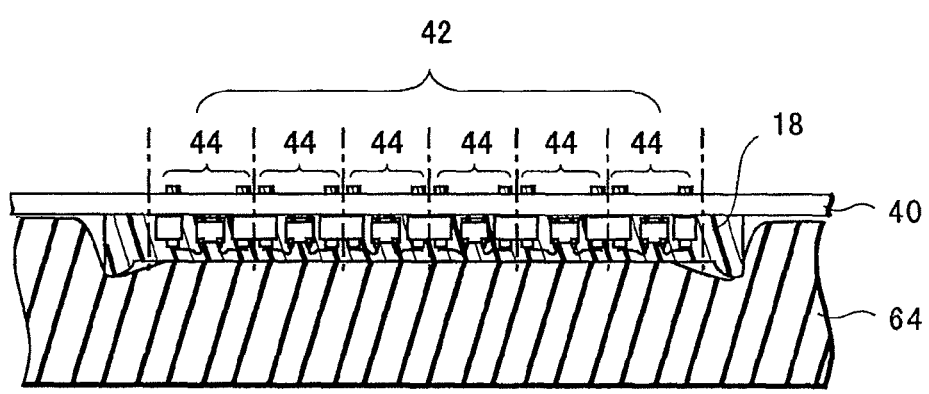
FIG. 7 is a cross-sectional view showing the method of manufacturing the circuit device of the preferred embodiment.
Figure 8A:
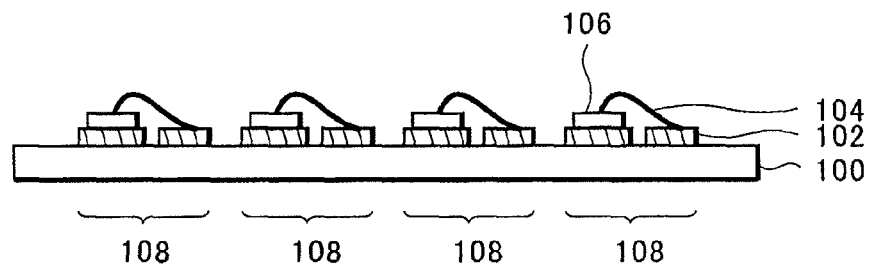
FIGS. 8A to 8D are cross-sectional views each showing a method of manufacturing a circuit device referred to in the description of the related art.
Figure 8B:
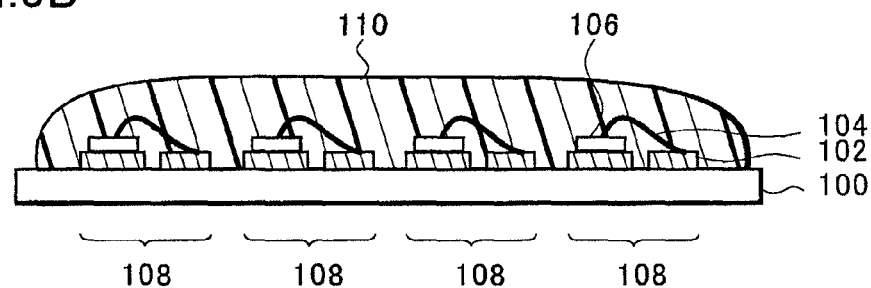
Figure 8C:
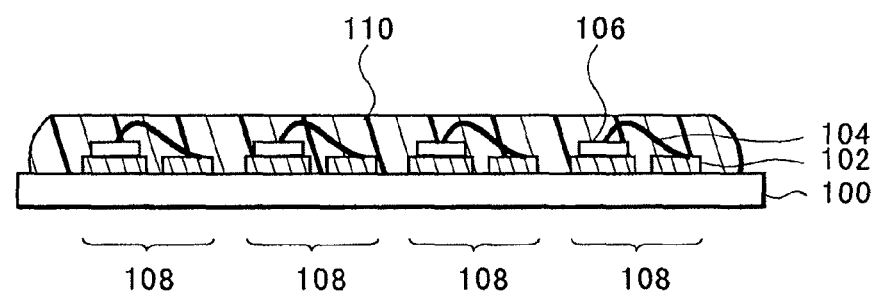
Figure 8D:
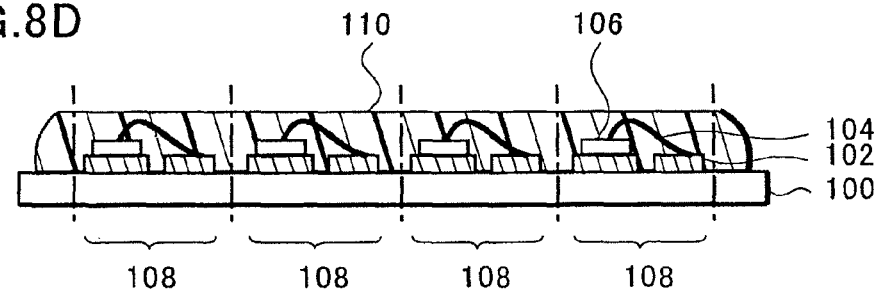
Figure 9:
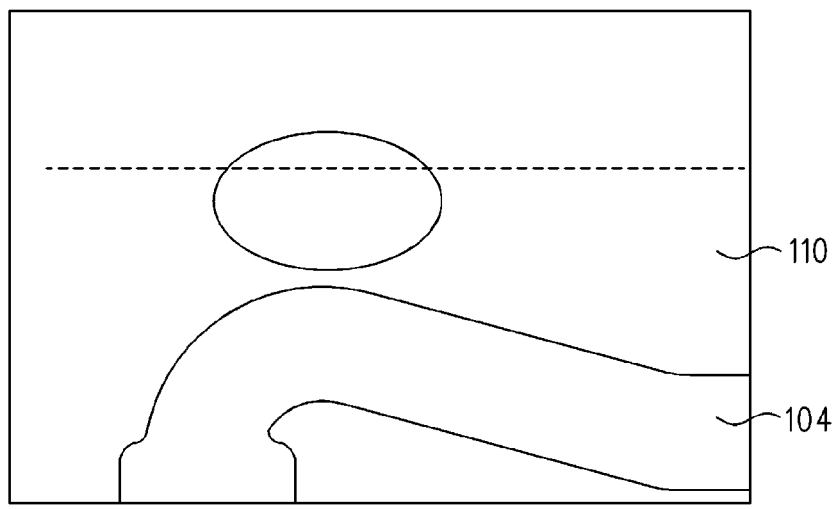
FIG. 9 is an image obtained by shooting the circuit device referred to in the description of the related art.

Referring to FIG. 7, the sealing resin 18 and the substrate 40 are divided at boundaries of the units 44 to obtain separate circuit devices 10. Specifically, firstly, the substrate 40 is bonded to a dicing sheet 64. Here, the principal surface of the substrate 40 with the sealing resin 18 formed thereon is bonded to the dicing sheet 64. Then, dicing is performed so that the substrate 40 and the sealing resin 18 can be divided at the boundaries of the units 44.

As a result of this step, periphery of the sealing resin 18 is shaped in such a manner that some portions of the sealing resin 18 protrude downwards, and thus the resin sealing might be damaged in these portions. However, the sealing resin 18 is formed so as to cover the substrate 40 in a larger area than the area where the units 44 are formed. Accordingly, the damage does not extend to a part, constituting the units 44, of the sealing resin 18.

By the above steps, the circuit device 10 having the structure shown in FIG. 1A is manufactured.

What is claimed is:

1. A circuit device comprising:
   a semiconductor element;
   a conductive member which is connected to the semiconductor element via a thin metal wire; and
   a sealing resin which comprises a resin material mixed with filler particles and which covers the semiconductor element and the thin metal wire, wherein the sealing resin includes a first portion and a second portion, the first portion of the sealing resin below a top portion of the thin metal wire, the second portion of the sealing resin between the top portion of the thin metal wire and a top surface of the sealing resin, and wherein the second portion has a first layer that includes filler particles and a second layer having no filler particles, a thickness of the second layer less than a thickness of the first layer, and
   wherein a thickness of the second portion of the sealing resin is smaller than a maximum diameter of the filler particles and wherein the second portion is continuous with the first portion.

2. The circuit device according to claim 1, wherein the thickness of the sealing resin above the top portion of the thin metal wire is not more than 40 μm.

3. The circuit device according to claim 2, wherein the top surface of the sealing resin is textured.

4. The circuit device according to claim 3, wherein each of the filler particles has a spherical shape.

5. The circuit device of claim 1, wherein the second layer is substantially 8 μm thick.

6. The circuit device of claim 1, wherein the conductive member is a conductive pattern formed on a principal surface of a substrate, and the sealing resin covers the principal surface of the substrate.

7. The circuit device according to claim 1 wherein an identification mark is engraved in the top surface of the sealing resin, and a depth of the identification mark is not more than 10 μm.

8. A method of manufacturing a circuit device, the method comprising the steps of:
- connecting an electrode formed on an upper surface of a semiconductor element to a conductive member via a thin metal wire; and
- covering the semiconductor element and the thin metal wire with a sealing resin by injection molding using a mold, the sealing resin including a first portion below a top portion of the thin metal wire, a second portion above the thin metal wire, and a third portion above the second portion, wherein the first portion includes resin material mixed with filler particles, the second portion includes at least some filler particles, and the third portion comprises additional resin material that does not include filler particles;
- wherein a thickness from the top portion of the thin metal wire to a top surface of the sealing resin is smaller than a maximum diameter of the filler particles.

9. The method of manufacturing a circuit device according to claim 8, wherein transfer molding is performed in the covering step, the transfer molding employing a thermosetting resin as the resin material.

10. The method of manufacturing a circuit device according to claim 9, wherein an inner wall of the mold is covered with a release sheet made of the resin material.

11. The method of manufacturing a circuit device according to claim 10, wherein a surface, facing inward, of the release sheet is a textured surface.

12. The method of manufacturing a circuit device according to claim 11, further comprising the step of engraving an identification mark in a principal surface of the sealing resin by partially removing the sealing resin by laser irradiation, wherein a depth of the identification mark is not more than 10 μm.

13. The method of claim 8, wherein covering the semiconductor element comprises covering the semiconductor element so that the third portion is substantially 8 μm thick.

14. A circuit device comprising:
- a semiconductor element;
- a conductive member which is connected to the semiconductor element via a thin metal wire; and
- a sealing resin which comprises a resin material mixed with filler particles and seals the semiconductor element and the thin metal wire,
- wherein a thickness of an uppermost portion of the sealing resin is smaller than a maximum diameter of the filler particles, the uppermost portion being defined as a portion of the sealing resin between a top portion of the thin metal wire and a top surface of the sealing resin,
- the uppermost portion of the sealing resin is continuous with the rest of the sealing resin, and
- the uppermost portion comprises a top layer having no filler particles and a bottom layer having filler particles, a thickness of the top layer being smaller than a thickness of the bottom layer.

15. The circuit device according to claim 14, wherein the thickness of the uppermost portion of the sealing resin is not more than 40 μm.

16. The circuit device according to claim 15, wherein the top surface of the sealing resin is textured.

17. The circuit device according to claim 16, wherein each of the filler particles has a spherical shape.

18. The circuit device of claim 14, wherein the top layer having no filler particles has a covering thickness of substantially 8 μm.

19. The circuit device of claim 14, wherein the conductive member is a conductive pattern formed on a principal surface of a substrate, and the sealing resin covers the principal surface of the substrate.

20. The circuit device according to claim 14, further comprising a cover layer on top of the sealing resin and having a different color than the sealing resin, wherein an identification mark is engraved in the cover layer to expose the sealing resin.

* * * * *